United States Patent [19]

Beverly

[11] Patent Number: 4,601,934

[45] Date of Patent: Jul. 22, 1986

[54] MASKING OF ELECTRICAL PRINTED CIRCUIT BOARDS

[76] Inventor: James A. Beverly, 529 Lomax, Idaho Falls, Id. 83401

[21] Appl. No.: 634,975

[22] Filed: Jul. 27, 1984

[51] Int. Cl.$^4$ ............................ B32B 7/06; B32B 7/12
[52] U.S. Cl. ....................................... 428/40; 428/345; 428/350; 428/516; 428/520; 428/332; 118/505
[58] Field of Search ................ 428/350, 345, 40, 516, 428/520, 332; 427/316, 154; 118/505

[56] References Cited

U.S. PATENT DOCUMENTS 2,632,921 3/1953 Kreidl ................................. 427/316
3,296,011 1/1967 McBride et al. ..................... 427/316
4,444,839 4/1984 Dudzik et al. .................. 428/350 X

*Primary Examiner*—Alexander S. Thomas
*Attorney, Agent, or Firm*—Fitch, Even, Tabin & Flannery

[57] ABSTRACT

A masking for use in connection with the manufacture of circuit board comprising a polyvinyl alcohol film, which is uniformly annealed to be free of stress and strains and which is water-soluble at a temperature of 120° F. A water-soluble adhesive, having a stiffness of between about medium soft and about medium, is placed on the film, and the masking material has a moisture level of below about 2% by weight.

6 Claims, No Drawings

MASKING OF ELECTRICAL PRINTED CIRCUIT BOARDS

The present invention relates generally to masking, and more particularly, it relates to a presssure sensitive masking for application to electrical printed circuit boards.

BACKGROUND OF INVENTION

The production of electrical printed circuit boards for computers, and the like, has been substantially standardized. The components are placed and soldered successively. In many cases, the circuit boards must pass through a solder flow a number of times, one passage before the other, before completion of the circuit boards. Various sections or components of the circuit boards, such as gold connector fingers and tracers, must be masked off so as to protect them from the solder flow.

In accordance with the usual practice in the industry, either liquid rubber, glass or poly tapes are applied to sections or components on the circuit board to mask off the solder flow. The liquid rubber must be cured before the soldering process can begin.

When the circuit board is ready for processing, i.e., soldering, a conveyor may carry the circuit board to a water-soluble flux where soldering is effected. On the other hand, the circuit board may be soldered in a rosin. After all solderings are complete, the rubber, poly, or glass tapes must be removed without damaging the gold contacts or other components. After removing the masking, the circuit boards pass to a final wash process in the case where a water-soluble flux has been used for removing the flux. When rosin is employed, the circuit board after soldering goes to a degrease, at temperatures from 50° F. to 380° F.

The known process employing water-soluble flux has two particular problems in respect to masking. First, the rubber masking can seep into small holes in areas where its removal is difficult to effect. Second, glass and other tapes leave a residue which interferes with the effective use of the circuit boards. As a result, a solvent cleaning step must be used to effect removal of the residues, in addition to the washing process.

It has been known to provide a masking comprising gums and salts, by applying wetted adhesive to the circuit boards. These masks, however, have not been successful, particularly because of leaving residues on the circuit board components which make it unsatisfactory. Such residues remain, even though the mask is washed from the circuit boards by solubilizing of the mask. Further, the required wetting of the adhesive inherently places moisture between the masking and circuit components, resulting in unsatisfactory soldering conditions. Additional problems encountered in using wetted adhesive, include a requirement for additional personnel and a period of 15 to 30 minutes for drying causing a slow operation and increased costs.

It is important that the masking not contaminate the circuit board components before and after removal, and that the masking be water-soluble, non-toxic, and biodegradable. Further, the masking material should be readily removable in existing washing operations for circuit boards.

The principal object of the invention is the provision of an improved masking for use in soldering operations, and particularly for use in the manufacture of electrical printed circuit boards and the like.

A further object of this invention is the provision of an improved masking which is water-soluble, non-toxic and biodegradable.

A still further object of the invention is the provision of an improved masking which can withstand the heat conditions inherent in the manufacture of the electrical printed circuit boards while maintaining its water-solubility and biodegradability.

Another object of the invention is the provision of a masking which can be readily applied during the manufacture of electrical printed circuit boards, and removed from the circuit components without leaving any residue upon the components.

Still further objects and advantages of the invention will become apparent by reference to the following description:

GENERAL DESCRIPTION OF INVENTION

The present invention is generally directed to the provision of an improved masking, particularly for use in the manufacture of printed electrical circuit boards. In accordance with the invention, a commercially available, water-soluble, polyvinyl alcohol (PVA) sheet is obtained which is water-soluble at 120° F. The sheet is annealed in order to relieve stress and strains within the sheet, and to provide the most effective masking.

The adhesive which is water-soluble at 120° F. and which comprises a film-forming material at a level of between about 50% and 70%; and an agent for providing tackiness to the adhesive in an amount of between about 30% and about 50%. An anti-oxidant is preferably included for preservative purposes. The polymeric and water-soluble adhesive is desirably made from about 59% polyvinyle alcohol (a film formant), 40% cyclic amide (a tackifier), and 1% hindered anti-oxidant (preservative). The adhesive is water-soluble at 120° F.

The characteristics of the adhesive are particularly important to the effective practice of the invention. The adhesive, like the PVA film, needs to be water-soluble, biodegradable, non-toxic, and separable from circuit board components without leaving residues. The adhesive should be applied to the sheet at thicknesses between about 0.5 mils and about 8 mils. The adhesive should be sufficiently elastic to conform to the components on the printed circuit board to effectively cover the components. The stiffness of the adhesive is an important characteristic and it should have a stiffness between medium soft and medium for effective use. If the adhesive is unduly stiff, it will not satisfactorily conform to the current board components. If the adhesive is too soft, the adhesive will flow around and away from the film when subjected to pressures in die stamping or otherwise processing of the masking. In addition, if the adhesive is too flowable, its essential characteristics will deteriorate. It may be desirable to stiffen the adhesive.

The adhesive must be able to withstand high temperatures normally experienced in the soldering operations. The adhesive should be able to withstand temperatures up to 600° F. of direct heat in the course of the manufacture of printed circuit boards. It is further important that the adhesive not become cross-linked or branched at the temperatures encountered, so as to significantly reduce its water-solubility or biodegradability. However, such cross-linking or branching may be effected to stiffen the adhesive to a limited degree.

It may be desirable, in some instances, to stiffen the adhesive to limit its flow. Various techniques can be used to stiffen the polymeric material, and by way of example, this may be effected by radiation, addition of accelerators, and various other means.

The adhesive should be mixed into an organic solvent as a carrier for the adhesive, and there should not be any water present in the solvent. The presence of water interferes with the manufacture of the masking and impairs its storage characteristics and operability. The organic solvent should not be miscible with water, and therefore, methanol containing water should not be used as a carrier for the adhesive. It is desirable that the organic solvent have a low boiling temperature and such temperature should be below about 100° F. It is further important that the solvent which is used not leave a residue upon evaporation which could remain on the circuit components. It has been found that a particularly effective solvent is a mixture of toluene and isopropyl alcohol. This mixture has the desired low boiling characteristics and evaporates readily without leaving an unsatisfactory residue. The solvent primarily serves as a carrier for the adhesive and provides uniform distribution of the adhesive in the manufacture of the masking of the invention.

A unique feature of the masking of the invention is its anti-static property. It is important in the manufacture of the printed circuit boards to avoid static conditions. Many films and sheet materials inherently build up static electricity in the course of handling and use. The anti-static property of the masking provides significant advantages in the use of it.

The masking is desirably supported upon a release sheet which is coated with a particular silicone release agent. The release agent should be separable from the adhesive so that when the adhesive is pulled away from the release sheet, the silicone does not adhere to the adhesive, thereby assuring that silicone is not transferred to the components on the printed circuit board. Further, the release agent should not be removed by the solvent for the adhesive.

It has been found that the ratio of toluene to isopropyl alcohol should be in the range of from 0.5 to 1.0 to 10.0 to 1.0. However, the principal purpose of the solvent is as a carrier, as previously indicated, for the adhesive material. The ratio of solvent to adhesive should be in the range of 2:1 to 4:1. It has been found that the viscosity of the adhesive in the solvent should be in the range of 4100 to 4500 CPS @ 4-20-77° F. (Brookfield RVF) in order to effectively apply the adhesive in the manufacture of the masking.

In the manufacture of the masking of the invention, the adhesive in the solvent is applied to the release paper, which is commercially available, at a thickness between 0.5 mils and 8 mils, and the coated release paper is passed through an oven to evaporate the solvent substantially completely from the adhesive. The release paper coated with the adhesive, upon leaving the oven, is combined with the polyvinyl alcohol (PVA) film which has been previously annealed.

The annealing of the film is an important step and feature of the invention in order to relieve stress and strains in the PVA film. However, the annealing should not be carried out to such degree that the water-solubility or biodegradability of the film is significantly affected. In this connection, the PVA film should be subjected to a temperature between about 160° F. and 225° F. for from ¾ minutes to 2.5 minutes, so as to cause the desired stress and strains relief. Preferably, annealing is effected with the PVA film being held at 180° F. for 1¾ minutes and then being cooled.

Upon exit of the coated release paper from the oven, it is important and necessary to combine the PVA film therewith under conditions which avoid moisture between the PVA film and the adhesive on the release paper. The presence of moisture is detrimental to the combination of the PVA film with the coated release paper. It has been found that, upon exit of the coated release paper from the oven after removal of the solvents, that the PVA film should be combined before a significant temperature drop, and more particularly, we have found that, under ambient conditions, the combination should be effected within 8 feet of the exit of the oven. While ambient humidity conditions can affect this distance, the avoidance of condensation is the important consideration.

Upon the combination of the PVA film with the adhesive-coated release paper, the masking is ready for storage or use. The masking should have a moisture of less than 2% by weight, and preferably less than 1% by weight. The masking can be die stamped in the form of dots, or other forms, or may be rolled in the form of a sheet or strip. Because of the characteristic of the masking, it should be stored under non-hygroscopic conditions so that it is not affected by humidity or moisture. The stored masking of the invention can be stored for extended periods of time without deterioration and is readily usable. The solder masking material is applied to those areas of electrical printed circuit boards which are to be masked and the circuit boards can then be soldered in accordance with normal and usual practices.

After the soldering is completed, the masking material can be readily removed in the normal washing of electrical printed circuit boards used in the industry, and, in this connection, such removal is usually effected in aqueous solutions at a temperature in the neighborhood of 140° F.

It has been found that after washing, there is zero contamination of the circuit components by the masking which has not been provided by available masking materials. The provision of the uncontaminated board with the utilization of the masking of the invention is a unique and significant contribution to the electrical printed circuit board art.

EXAMPLE 1

In accord with this example, a water-soluble PVA film is obtained which is known as Mono-Sol film NS-2 Series sold by Mono-Sol, a division of Chris-Craft Industries, Inc. The film has the following properties:

| PROPERTY | | TEST METHOD |
|---|---|---|
| Yield | 21,600 sq. in. | |
| Tensile; psi | Min. 6000 | Suter; ATSM D882-49T |
| Tear; gm/mil | Min. 500 | Elmendorf; ATSM D689-44 |
| 100% Modulus psi | Min. 2000 | Suter; ATSM D882-49T |
| Ultimate % | Min. 350 | Suter; ASTM D882-49T |

BOD Level Five day BOD level is 90 parts per million parts of solution; i.e. - the theoretical amount of oxygen required to oxidize the PVA in 5% solution is 90,000 parts oxygen per million parts of solution.

The film was annealed at a temperature of 180° F. for 1¾ minutes.

A polymeric and water-soluble adhesive is made from 59% polyvinyl alcohol (a film formant) and 40% cyclic amide (a tackifier), and 1% hindered anti-oxidant (preservative). The water-soluble adhesive is in solution. The percentage of toluene in the adhesive solution is 33% and the percentage of isopropyl alcohol in the solution is 33%. The solution has a viscosity of 300 plus/minus 500 CPS @ 4-20-77° F. (Brookfield RVF). The solution is distributed onto a release sheet using silicone as a release agent on the sheet. The adhesive is distributed onto a sheet by adjusting the application to provide a one-mil dry thickness of adhesive on the sheet.

The coated release sheet is passed through an oven at 250° F. to remove the toluene and isopropyl alcohol. The coated release sheet remained in the oven for 4.2 minutes, and the temperature and time conditions caused the solvent to be removed. The adhesive had a tacky surface. The PVA film is applied to the adhesive surface within 8 feet of leaving the oven to avoid condensation and moisture inclusion and pressed thereon to provide the masking of the invention.

Because of the annealing of the PVA film, and because of the absence of moisture or water in the solvent, the PVA film even upon aging, continues to conform to the release coated sheet without shrinkage or curling. The presence of moisture in the solvent results in curling of the adhesive coated PVA film and the presence of moisture in the solvent has caused shrinkage upon storing of the masking material. The masking does not have any significant static problems which would interfere with the circuit board manufacture.

The completed masking was rolled up as a tape and over-wrapped with plastic film to protect it from humidity conditions. It has been found that the wrapped masking could be stored for longer than one year without deterioration, shrinkage or other effects upon the tape.

The various features of the invention which are believed to be new are set forth in the following claims.

What is claimed is:

1. A masking comprising, in combination, a polyvinyl alcohol film, which is uniformly annealed to be free of stress and strains and which is water-soluble at a temperature of 120° F., and a water-soluble adhesive on said film, said adhesive having a stiffness of between about medium soft and about medium; said masking material having a moisture level of below about 2% by weight.

2. A masking in accordance with claim 1 further including a release paper having a release agent thereon in contact with said water-soluble adhesive.

3. A masking in accordance with claim 2, wherein the release, material is coated with a silicone release agent which will not release to set adhesive.

4. A masking in accordance with claim 1, where said water-soluble adhesive is on said film at a thickness between 0.5 mils and 8 mils and can withstand direct heat up to 600° F.

5. A masking in accordance with claim 1, wherein the water-soluble adhesive comprises 59% polyvinyl alcohol 40% cyclic amide and 1% hindered anti-oxidant.

6. A masking in accordance with claim 1, wherein the annealed film has been annealed at a temperature between about 160° F. and about 225° F. for from ¾ minutes to 2.5 minutes.

* * * * *

UNITED STATES PATENT AND TRADEMARK OFFICE
CERTIFICATE OF CORRECTION

PATENT NO. : 4,601,934

DATED : July 22, 1986

INVENTOR(S) : James A. Beverly

It is certified that error appears in the above-identified patent and that said Letters Patent is hereby corrected as shown below:

Column 1, Line 37, change "degrease" to --decrease--.

Column 5, Line 5, change "300" to --4300--.

Column 6, Line 19, after "release" delete --,-- (comma).

Line 27, after "alcohol" insert --,-- (comma).

Signed and Sealed this

Twenty-first Day of October, 1986

[SEAL]

*Attest:*

DONALD J. QUIGG

*Attesting Officer*   *Commissioner of Patents and Trademarks*